(12) United States Patent
Okada

(10) Patent No.: US 7,719,349 B2
(45) Date of Patent: May 18, 2010

(54) FILTER CIRCUIT FOR WIRELESS APPLICATIONS AND NOISE REDUCTION METHOD

(75) Inventor: Hiroyuki Okada, Tokyo (JP)

(73) Assignee: NEC Corporation, Tokyo (JP)

( * ) Notice: Subject to any disclaimer, the term of this patent is extended or adjusted under 35 U.S.C. 154(b) by 101 days.

(21) Appl. No.: 11/911,674

(22) PCT Filed: Mar. 22, 2006

(86) PCT No.: PCT/JP2006/305670

§ 371 (c)(1),
(2), (4) Date: Oct. 16, 2007

(87) PCT Pub. No.: WO2006/117943

PCT Pub. Date: Nov. 9, 2006

(65) Prior Publication Data

US 2008/0284505 A1    Nov. 20, 2008

(30) Foreign Application Priority Data

Apr. 28, 2005    (JP)    ............................. 2005-131331

(51) Int. Cl.
*H03K 5/00*    (2006.01)
(52) U.S. Cl. ........................................ 327/553; 327/552
(58) Field of Classification Search .......... 327/551–559
See application file for complete search history.

(56) References Cited

U.S. PATENT DOCUMENTS 6,112,125 A  *  8/2000  Sandusky ..................... 700/28
6,400,218 B1    6/2002  Zocher et al.
6,549,074 B2 *  4/2003  Ugajin et al. ................ 330/258
6,556,073 B2 *  4/2003  Morie et al. ................. 327/554
6,680,627 B2 *  1/2004  Hughes ....................... 327/103
6,853,249 B2 *  2/2005  Cyrusian .................... 330/253

FOREIGN PATENT DOCUMENTS

| JP | 5-114836 A | 5/1993 |
|---|---|---|
| JP | 6-61791 A | 3/1994 |
| JP | 10-178333 A | 6/1998 |
| JP | 11-177357 A | 7/1999 |
| JP | 2001-292051 A | 10/2001 |
| JP | 2002-198778 A | 7/2002 |
| JP | 2003-347866 A | 12/2003 |
| JP | 2004-120306 A | 4/2004 |
| JP | 2007504762 A | 3/2007 |

OTHER PUBLICATIONS

"Analog CMOS Filters for Very High Frequencies", Kluwer Academic Publishers, 1993, pp. 87-88.
T. Hanusch, "Analog Baseband-IC for Dual Mode Direct Conversion Receiver", ESSCIRC96, proceeding, Sep. 1996, pp. 244-246.

* cited by examiner

*Primary Examiner*—Dinh T. Le
(74) *Attorney, Agent, or Firm*—Sughrue Mion, PLLC

(57) ABSTRACT

An object of the present invention is to provide a filter circuit which improves NF of a Gm-C filter. The filter circuit comprises a filter comprising at least one first operational transconductance amplifier whose mutual conductance varies depending on a first control signal and a first capacitor, a second operational transconductance amplifier whose mutual conductance is controlled by the first control signal, a third operational transconductance amplifier whose mutual conductance is controlled by a second control signal, and a second capacitor connected to output terminals of the first and second operational transconductance amplifiers and input terminals of the filter.

5 Claims, 13 Drawing Sheets

FILTER CIRCUIT FOR WIRELESS APPLICATIONS AND NOISE REDUCTION METHOD

TECHNICAL FIELD

The present invention relates to a low-pass filter circuit for wireless applications and a noise reduction method, and more particularly to a wireless filter circuit fabricated of semiconductors and a noise reduction method using such a wireless filter circuit.

BACKGROUND ART

In recent years, wireless systems have been used as means for transmitting information between devices by mobile electronic devices, household electric appliances, and peripheral devices for personal computers. The wireless systems for use by the electronic devices are fabricated as integrated semiconductor circuits having reduced size, weight, and cost. Generally, a wireless system requires a filter having a sharp cutoff frequency for separating a certain frequency component. However, since components used in integrated semiconductor circuits have large production tolerances, it has been difficult to produce filter circuits with sharp cutoff frequencies as integrated semiconductor circuits. For this reason, Gm-C filters comprising an operational transconductance amplifier (OTA) and capacitor have been used.

There are known a wireless system manufactured as an integrated semiconductor circuit and Gm-C filters used in such a wireless system, which have the structure disclosed in U.S. Pat. No. 6,400,218B1 as shown in FIGS. 1 and 2.

In the structure shown in FIG. 1, an RF signal input from antenna 104 is amplified by low-noise amplifier 106, and separated into I/Q baseband signals by local oscillator 101 and mixers 108, 109. The separated I/Q baseband signals are filtered by Gm-C filters 112, 113 to produce desired baseband signals. The signals input to Gm-C filters 112, 113 are limited in amplitude by amplitude limiting circuits 110, 111, so that the signals in required bands will not be saturated by Gm-C filters 112, 113.

Gm-C filters 112, 113 are constructed of OTAs 203 through 205, as shown in FIG. 2a, and their equivalent circuit is shown in FIG. 2b.

In FIGS. 2a and 2b, capacitor 206 shown in FIG. 2a is the same as capacitor 210 shown in FIG. 2b, and capacitor 208 shown in FIG. 2a is the same as capacitor 211 shown in FIG. 2b. A circuit made up of OTAs 201 through 204 and capacitor 207 shown in FIG. 2a is equivalent to variable inductor 212 and variable inductor 213 shown in FIG. 2b. OTA 205 with its output terminals connected to inverting input terminals shown in FIG. 2a is equivalent to variable resistor 214 shown in FIG. 2b.

The basic principles of a Gm-C filter will be described below with reference to FIG. 3. In FIG. 3, OTAs and a capacitor make up a low-pass filter of the first order. OTA 301 and OTA 302 have their mutual conductances $G_{m1}$, $G_{m2}$ controlled by respective $G_m$ control signals 303, 304 which are supplied from an external source. At this time, if ($G_m$ of OTA)$\gg$(1/OTA output resistance) and $C_L \gg$ (OTA output and input capacitances), then the relationship between input $V_{in}$ and output $V_{out}$ is expressed as $V_{out}/V_{in}=G_{m2}/(sC_L+G_{m1})$ where s represents the Laplace operator. Based on this relationship, cutoff frequency $\omega_P$ is expressed as $G_{m1}/C_L$.

Generally, the capacitance of capacitor $C_L$ fabricated as an integrated semiconductor circuit varies due to production tolerances and temperature fluctuations. However, even when capacitor $C_L$ varies, cutoff frequency $\omega_P$ can be kept constant by controlling mutual conductance $G_{m1}$ of OTA 301 with $G_m$ control signal 303 supplied from a replica circuit, not shown. Based on this principle, OTAs and capacitors may be combined as shown in FIG. 2a to provide a filter of high order having the same function as shown in FIG. 2b.

An OTA of the related art whose mutual conductance $G_m$ can be controlled will be described below.

A degenerated differential OTA introduced in Bran Nauta, "Analog CMOS Filters for Very High Frequencies", Kluwer Academic Publishers, 1993, pp. 87-88, and OTA disclosed in JP-A No. 2001-292051 are known as OTAs whose mutual conductance $G_m$ can be controlled.

FIGS. 4a and 4b show such OTAs. Operation of the OTA shown in FIG. 4a will first be described below. Current sources 404, 405, 406, 407 supply the same current value. The resistive component of variable resistor 403 that is connected to the sources of input transistors 401, 402 has its resistance value variable dependent on mutual conductance control signal 408 supplied from an external circuit.

When the mutual conductances of input transistors 401, 402 are sufficiently large, a current of $\Delta V/R/2$ flows from the outputs where R represents the resistive component of variable resistor 403 and $\Delta V$ the voltage of the differential component between input voltage signals. Therefore, any desired mutual conductance $G_m$ can be achieved by controlling the resistance value of variable resistor 403 with control signal 408.

Operation of the OTA shown in FIG. 4b will be described below. OTA 411 comprises at least low-level OTAs 412 connected parallel to each other. OTAs 12 have their mutual conductances $G_m$ selectively changeable to positive or negative values or can selectively switch into or out of operation based on control signal 413 from an external circuit. When OTAs 412 have their mutual conductances $G_m$ selectively changed to positive or negative values or when they selectively switch into or out of operation, output currents from parallel-connected OTAs 12 are added or subtracted, with the result that the mutual conductance $G_m$ of OTA 411 is variable.

As shown in FIG. 5a, a wireless system may have signal $P_b$ that has a large amplitude appearing outside the required signal band due to a signal from another wireless system. When such a signal is input to a filter, if the filter comprises passive elements only as shown in FIG. 2b, then the filter is not adversely affected by signal $P_b$. However, if the filter comprises a Gm-C filter as shown in FIG. 2a, then some of the OTAs of the Gm-C filter may have their signals saturated or distorted due to a limited power supply voltage. This problem manifests itself especially when the circuit requires a relatively large amplitude in order to obtain sharp cutoff characteristics if the filter is a filter of a high order.

A process of improving such adverse effects due to signal $P_b$ is disclosed in T. Hanusch, "Analog Baseband-IC for Dual Mode Direct Conversion Receiver", ESSCIRC96, proceeding, September 1996, pp. 244-246. The process will be described below with reference to FIG. 6.

FIG. 6 shows circuit blocks around filters. In this example, low-pass filter 601 of the first order comprising passive elements, in addition to a semiconductor chip, is inserted for removing signal $P_b$ that has a large amplitude appearing outside the band as shown in FIG. 5a. A signal output from low-pass filter 601 of the first order is amplified by gain control amplifier 602, and input to filter 603 of the high order for extracting a signal in a required band. Gain control amplifier 602 is placed in the front stage of filter 603 and gain control amplifier 604 is placed in the front stage of filter 605 for the following reasons:

Generally, it is known that since a filter fabricated as an integrated semiconductor circuit, e.g., a Gm-C filter, is made up of many parts, as shown in FIGS. 2(a) and 2(b), the semiconductor components of the circuit produce a large amount of noise, which lowers NF. NF represents the ratio of an output signal/noise ratio to an input signal/noise ratio, and serves as a parameter indicating that the amount of noise generated in the system is larger as NF is greater. There is known a process of improving NF by reducing noise generated by the components of the circuit and a process of improving NF by amplifying a signal input to the system in a front stage.

The process of reducing noise generated by the components of the circuit suffers limitations due to specifications including the frequency band and current consumption. The process of amplifying a signal input to the system in a front stage is an effective process of improving NF, and has amplifiers placed in the front stages of the filters for amplifying the signals before noise is added thereto, as shown in FIG. 6.

DISCLOSURE OF THE INVENTION

Problems to be Solved by the Invention

The first problem of the related art is as follows:

In FIG. 6, low-pass filter 601 of the first order is inserted in the front state of a filter including a gain control circuit. The purpose of low-pass filter 601 of the first order thus inserted is to reduce signal distortions caused by unwanted signal $P_b$ outside of the band which is added due to adjacent channels and signals from another wireless system. If the unwanted signal outside of the band is attenuated by low-pass filter 601 of the first order, but has a signal power level higher than the signal power level in the required band, as shown in FIG. 5b, then the signal is saturated by attenuated signal $P_b'$ in next-stage gain control amplifier 602, causing signal distortion. To solve this problem, a circuit is needed to detect the level of the signal for preventing gain control amplifier 602 from being saturated and to control the gain of gain control amplifier 602 even through low-pass filter 601 is inserted. As a result, the illustrated arrangement leads to an increase in circuit area and power consumption.

The low-pass filters of the first order added to the front stages of the filters including the gain control circuits as shown in FIG. 6 produce a correspondingly increased noise. As the wireless system is affected by greater noise at stages closer to the input stage, the noise generated by the arrangement shown in FIG. 6 is nonnegligibly large in the wireless system.

The present invention has been made in view of the problems of the related art. It is an object of the present invention to provide a filter circuit which improves filter NF and reduces the effect of a signal outside of a required signal band which is generated due to a signal from another wireless system.

Means for Solving the Problems

A filter circuit according to the present invention comprises:

a filter comprising at least one first operational transconductance amplifier whose mutual conductance varies depending on a first control signal and a first capacitor;

a second operational transconductance amplifier whose mutual conductance is controlled by the first control signal;

a third operational transconductance amplifier whose mutual conductance is controlled by a second control signal; and a second capacitor connected to output terminals of the first and second operational transconductance amplifiers and input terminals of the filter.

A filter circuit according to another aspect of the present invention comprises:

a filter comprising at least one first operational transconductance amplifier whose mutual conductance varies depending on a first control signal and a first capacitor;

a second operational transconductance amplifier whose mutual conductance is controlled by the first control signal;

a third operational transconductance amplifier whose mutual conductance is controlled by the first control signal and whose mutual conductance can be controlled so as to be equalized to a multiple of a real number by a second control signal; and a second capacitor connected to output terminals of the first and second operational transconductance amplifiers and to input terminals of the filter.

The third operational transconductance amplifier may comprise at least two fourth operational transconductance amplifiers whose input and output terminals are connected parallel to each other, and the fourth operational transconductance amplifiers may have a mutual conductance controlled by the first control signal and can be activated and inactivated by the second control signal.

Specifically, each of the fourth operational transconductance amplifiers may comprise at least one P-channel transistor pair whose source potential varies depending on the first control signal and a switch connected between the P-channel transistor pair and a power supply, and the switch can be turned on and off by the second control signal.

Each of the fourth operational transconductance amplifiers may comprise at least one N-channel transistor pair whose source potential varies depending on the first control signal and a switch connected between the P-channel transistor pair and a power supply, and the switch can be turned on and off by the second control signal.

The second operational transconductance amplifier may have output terminals inverted and connected to input terminals thereof.

A method of controlling a filter circuit according to the present invention resides in that the ratio of the mutual conductance of the second operational transconductance amplifier and the mutual conductance of the third operational transconductance amplifier is controlled such that cutoff frequency cop of the filter circuit, signal frequency $\omega_q$ of an unwanted signal introduced from an external source, and gain $A_v$ of the filter circuit satisfy the relationship: $A_v < \omega_q < \omega_P$.

A filter circuit according to still another aspect of the present invention comprises at least two operational transconductance amplifiers and a capacitor, wherein cutoff frequency $\omega_P$ of the filter circuit, signal frequency $\omega_q$ of an unwanted signal introduced from an external source, and gain $A_v$ of the filter circuit satisfy the relationship: $A_v < \omega_q < \omega_P$.

Advantages of the Invention

According to the present invention, there is provided a filter circuit which improves filter NF and reduces the effect of a signal outside of a required signal band which is generated due to a signal from another wireless system.

BRIEF DESCRIPTION OF THE DRAWINGS

FIG. 2b is an equivalent circuit of FIG. 2a;

Figure 1:
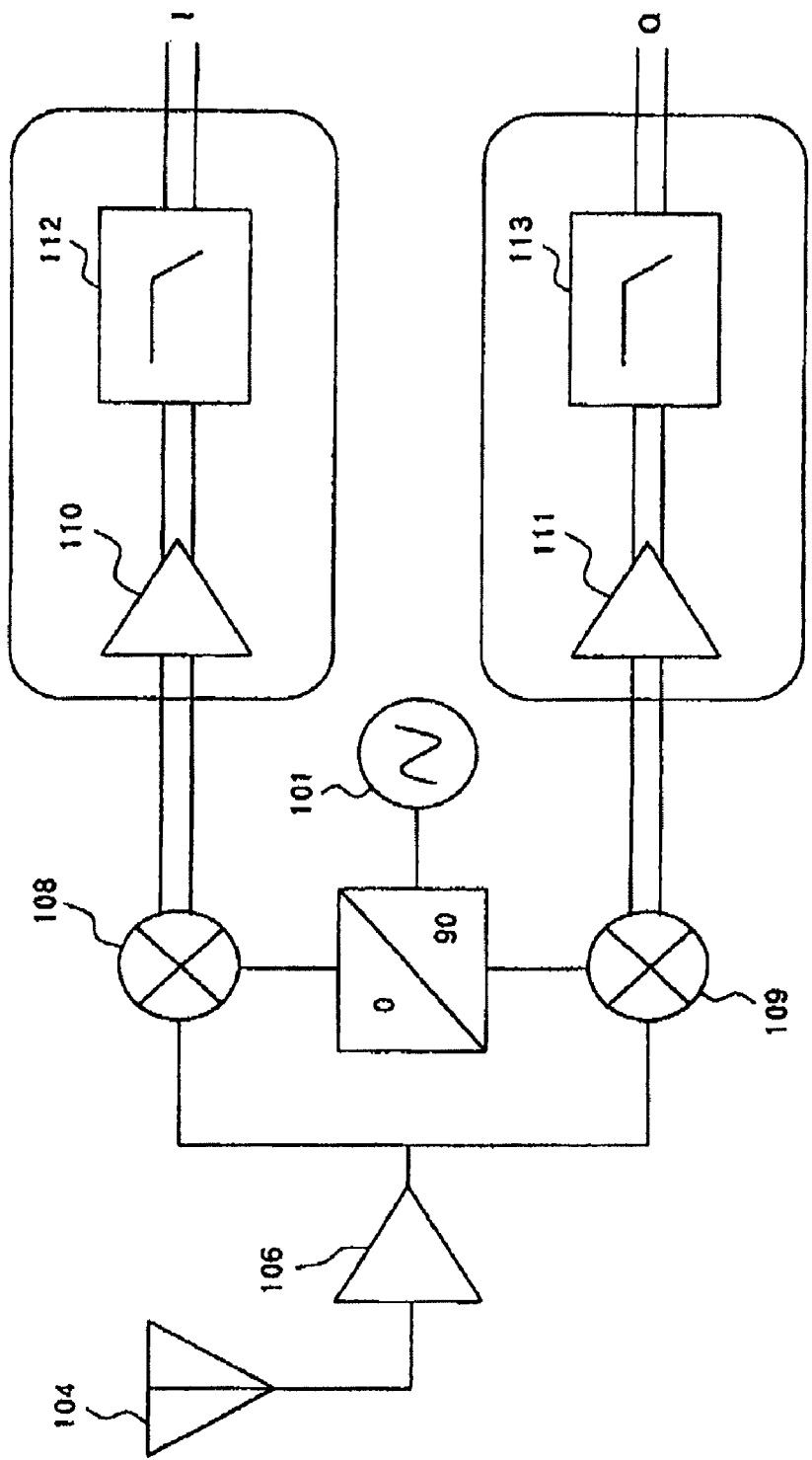
FIG. 1 is a block diagram of an example of a wireless system fabricated as integrated semiconductor circuits according to the related art.

DESCRIPTION OF REFERENCE CHARACTERS 104 antenna
106 low-noise amplifier
108 mixer
110 amplitude limiting circuit
112 Gm-C filter
201-205 OTA
212 variable inductor
214 variable resistor
301-302 OTA
401, 402 input-stage transistor
403 variable resistive component
404-407 current source
408 control signal
411 OTA
412 low-level OTA
413 control signal
701, 702, 704, 706 OTA
703 Gm-C filter
701 variable-gain amplifier (VGA)
711, 710 mutual conductance control line
801 characteristics of VGA
802 necessary signal
901, 902, 904, 906 OTA
903 Gm-C filter
907 VGA 910
911 mutual conductance control signal line
1006, 1002 OTA
1001, 1003, 1004 low-level OTA
1101 mutual conductance control line
1002 switch
1104 switch

BEST MODE FOR CARRYING OUT THE INVENTION

Exemplary embodiments of the present invention will be described below with reference to the drawings.

1st Exemplary Embodiment

Figure 7:
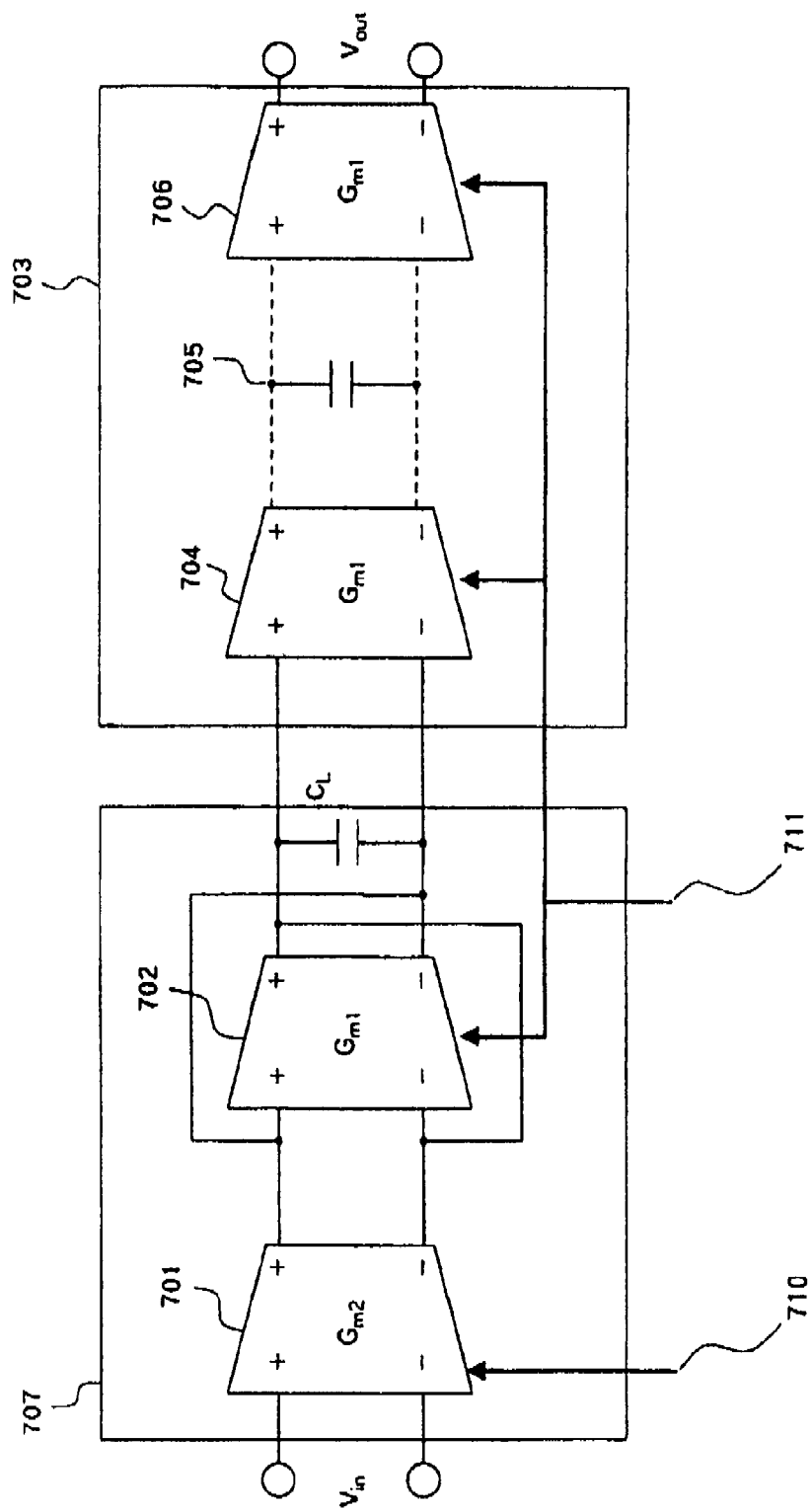
FIG. 7 is a circuit diagram of an arrangement of a Gm-C filter according to a first exemplary embodiment of the present invention.

FIG. 7 is a block diagram showing an arrangement of a filter circuit according to a first exemplary embodiment of the present invention. The filter circuit according to the present exemplary embodiment comprises variable-gain amplifier (VGA) 707 and Gm-C filter 703.

Gm-C filter 703 comprises at least one or more OTAs 704, 706 and capacitor 705. OTA 704 has its mutual conductance controlled by the same control signal 711 as with OTA 706.

Variable-gain amplifier 707 comprises OTA 702 whose mutual conductance is controlled by the same control signal 711 as with OTAs 704, 706, OTA 701 whose mutual conductance is controlled by control signal 710 independently of OTAs 702, 704, 706, and capacitor $C_L$.

Figure 2A:
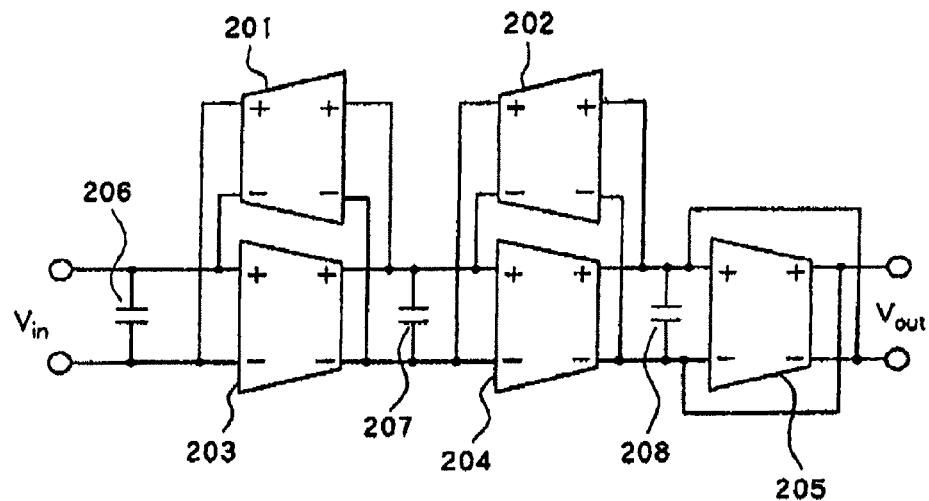
FIG. 2a is a diagram of an example of a Gm-C filter employing OTAs according to the related art.
Figure 2B:
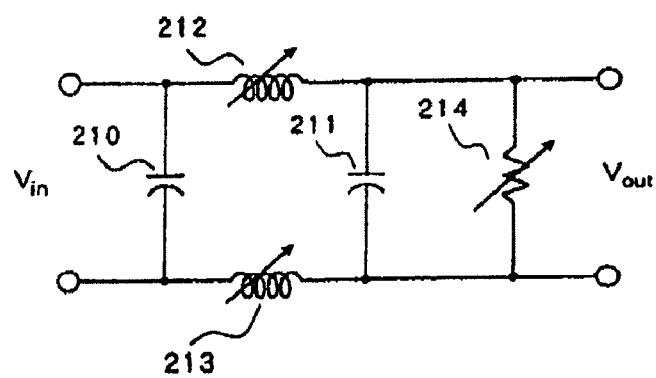

OTA 701 is connected to OTA 702 whose output terminals are connected to inverting input terminals, capacitor $C_L$, and input terminals of Gm-C filter 703. OTAs 702, 704, 706 have their mutual conductance $G_{m1}$ controlled by a signal supplied from mutual conductance control line 711. OTA 701 has its mutual conductance $G_{m2}$ controlled by mutual conductance control line 710 independent of mutual conductance control line 711. Gm-C filter 703 is not limited to any specific configuration particular details, but may comprise the Gm-C filter shown in FIG. 2a, for example.

Figure 3:
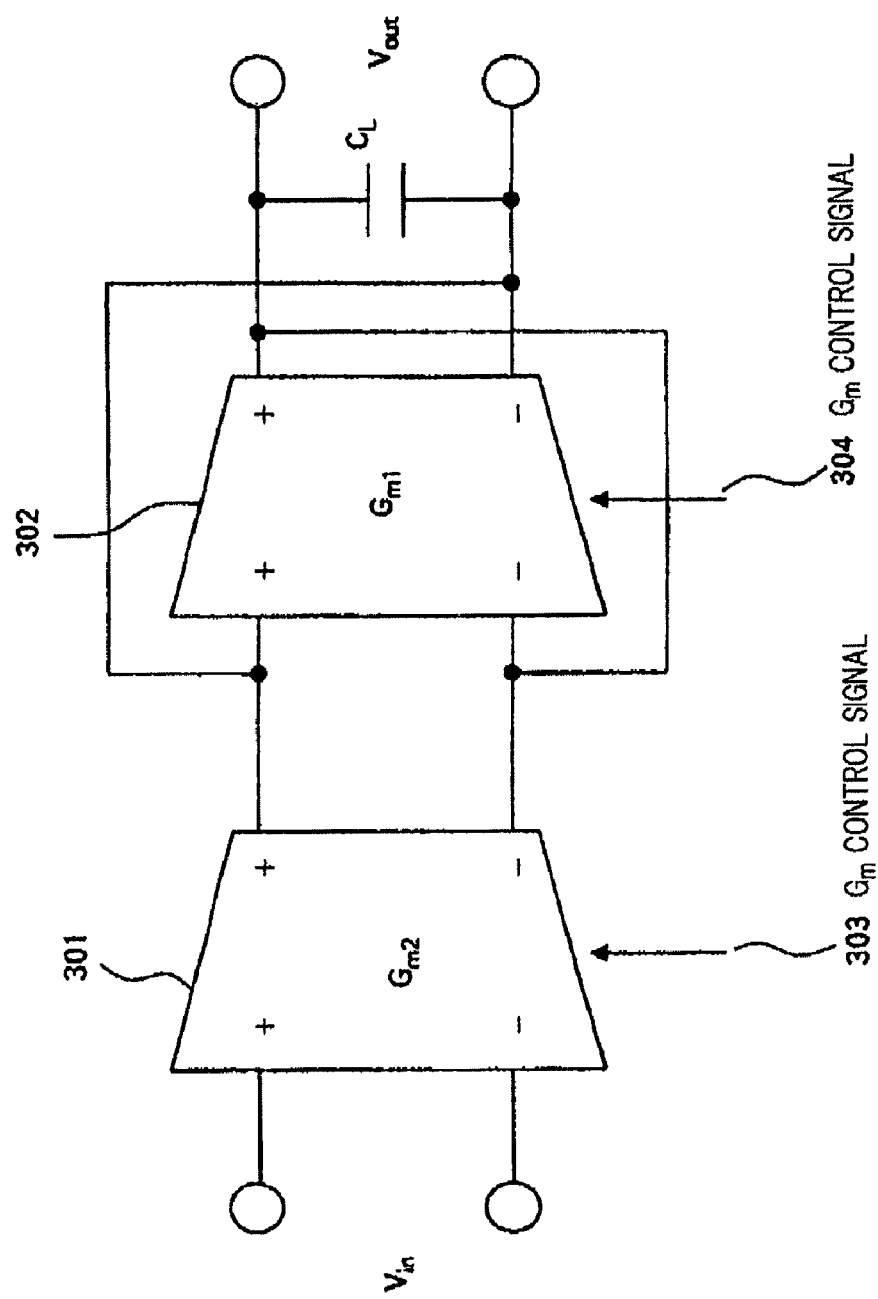
FIG. 3 is a circuit diagram of a low-pass filter circuit of the first order according to the related art, the view being illustrative of the basic operation of the Gm-C filter.

The function of the signal supplied from mutual conductance control line 711 will first be described below. According to the Gm-C filter of first order shown in FIG. 3, if ($G_m$ of OTA)$\gg$(1/OTA output resistance) and $C_L \gg$(OTA output and input capacitances), then $$A_v = V_{out}/V_{in} = G_{m2}/(sC_L + G_{m1}) \quad (1)$$

Based on the above relationship, cutoff frequency $\omega_P$ is expressed as $$\omega_P = G_{m1}/C_L \quad (2)$$

A stable cutoff frequency can thus be achieved by controlling $C_{m1}$ such that $G_{m1}/C_L$ will be a constant ratio at all times regardless of changes in capacitance $C_L$ due to semiconductor fabrication variations and temperature fluctuations. This principle is also applicable to a high order Gm-C filter. It is possible to achieve stable sharp cutoff characteristics by controlling the mutual conductance of all OTAs of the Gm-C filter with the same control line, based on the fact that relative variations of the OTAs and capacitor $C_L$ of the Gm-C filter are small. Generally, the mutual conductance is automatically controlled by a replica circuit comprising the same OTAs as the OTAs of the Gm-C filter. Consequently, a Gm-C filter has a constant cutoff frequency at all times regardless of process variations and temperature fluctuations, based on the control signal supplied from mutual conductance control line 711.

Operation of variable-gain amplifier (VGA) 707 shown in FIG. 7 will be described below. As shown in FIG. 7, VGA 707 is of the same arrangement as the low-pass filter of the first order shown in FIG. 3. Therefore, gain $A_v$ and cutoff frequency cop are expressed according to equations (1), (2).

Since the mutual conductance of OTA 702 is controlled by mutual conductance control signal 711 supplied to Gm-C filter 703, a desired stable cutoff frequency can be achieved according to the principles of the Gm-C filter. As indicated by the equation (1), a desired gain can be achieved by setting mutual conductance $G_{m2}$ of OTA 701 to a desired value.

Figure 8:
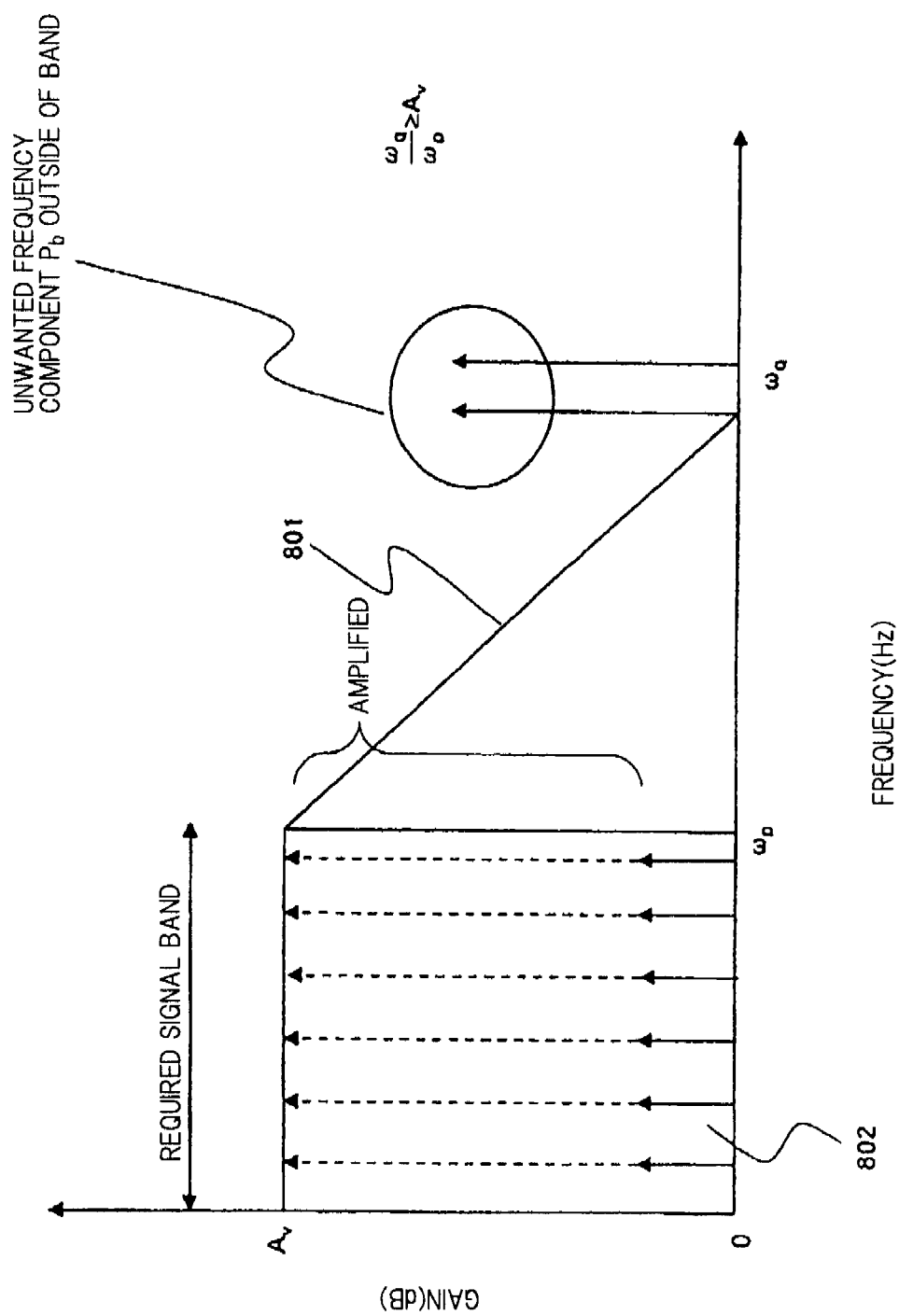
FIG. 8 is a diagram showing frequency characteristics of signals in a wireless system, the view being illustrative of operation of the present invention.

As shown in FIG. 8, if it is assumed that the frequency of unwanted signal $P_b$ outside of the required band is represented by $\omega_q$, the cutoff frequency by $\omega_P$, and the gain by $A_v$, then $C_L$, $G_{m1}$, $G_{m2}$ of the equation (2) can be selected to achieve the relationship:

$$\omega_q/\omega_P > A_v \quad (3)$$

When the condition (3) is met, it is possible to amplify only the signal in the required band without amplifying the signal outside of the required band. Therefore, the VGA functions as a VGA whose gain is controlled depending on the magnitude of the signal by setting capacitance $C_L$ and mutual conductance $G_{m1}$ to achieve a cutoff frequency to provide a gain of 0 at the frequency of the unwanted signal outside of the expected band so that required signal 802 shown in FIG. 8 has VGA characteristics 801, and by controlling mutual conductance $G_{m2}$ with mutual conductance control signal 710.

When the signal is small, the gain of the VGA is set to a large value for thereby improving NF. In FIG. 7, OTAs 704, 706 of Gm-C filter 703 and OTA 702 of VGA 707 are shown as having the same mutual conductance ($G_{m1}$) for the sake of brevity. However, these OTAs may not necessarily have the same mutual conductance, insofar as their mutual conductance is controlled by same mutual conductance control signal 711.

According to the present invention, as described above, it is possible to improve NF of a Gm-C filter by amplifying a signal in a required band without amplifying an unwanted signal component outside of the band.

2nd Exemplary Embodiment

Figure 9:
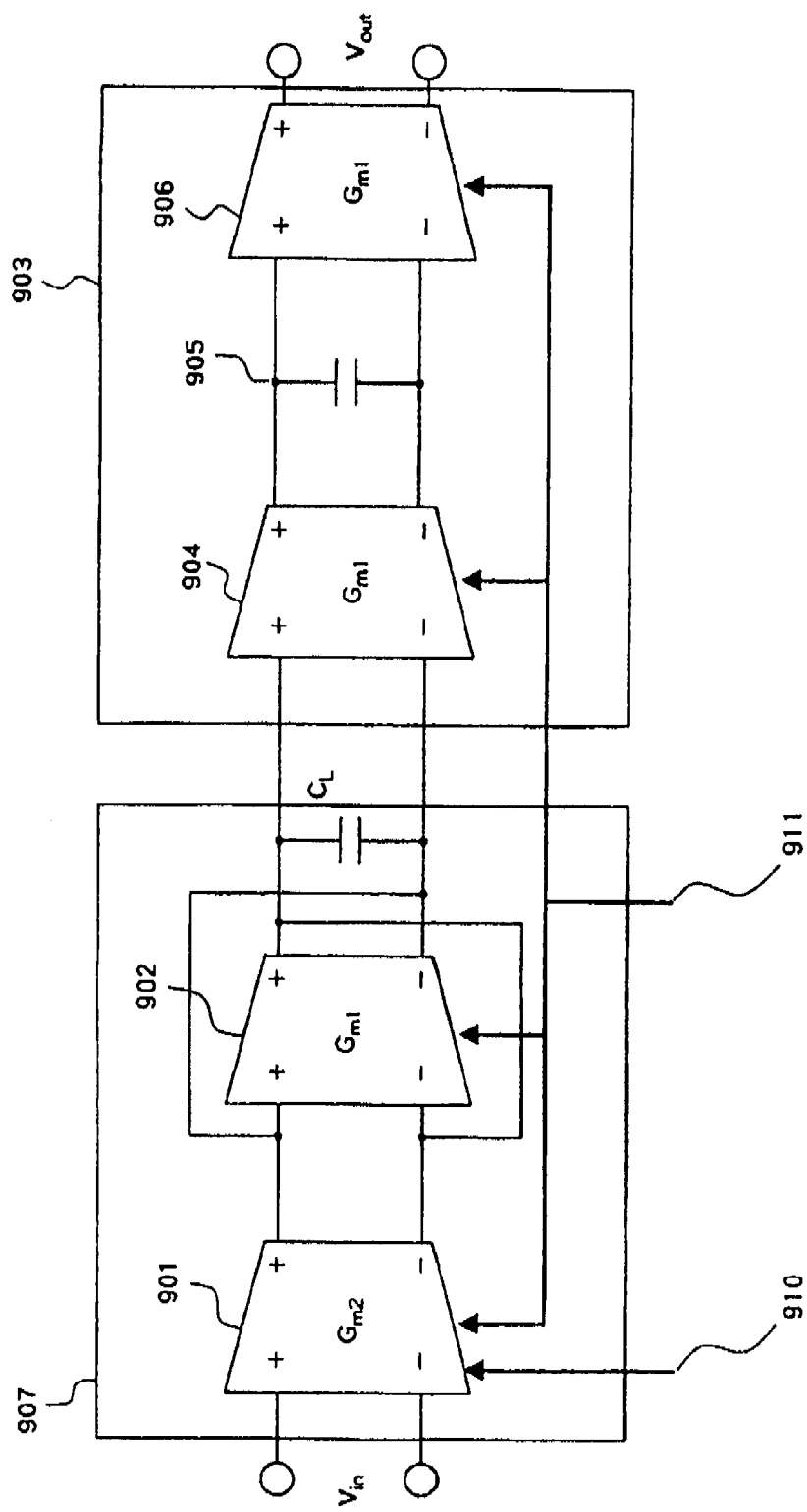
FIG. 9 is a circuit diagram of an arrangement of a Gm-C filter according to a second exemplary embodiment of the present invention.

FIG. 9 shows an arrangement of a filter circuit according to a second exemplary embodiment of the present invention. As shown in FIG. 9, the filter circuit comprises Gm-C filter 903 including at least one or more OTAs 904, 906 and capacitor 905, and VGA 907 comprising OTA 902 whose mutual conductance is controlled by the same control signal 911 as with OTAs 904, 906, OTA 901 whose mutual conductance is controlled by the same control signal as OTAs 902, 904, 906 and whose mutual conductance can be changed into mutual conductance ($G_{m2}=kG_{m1}$) that is represented by a multiple by a positive real number of mutual conductance ($G_{m1}$) of OTA 902, and capacitor $C_L$. OTAs 901, 902, 904, 906 have their mutual conductance controlled by a signal supplied from mutual conductance control line 911. OTA 901 has its mutual conductance $G_{m2}$ controlled by mutual conductance control line 910 independent of mutual conductance control line 911.

Operation of the present exemplary embodiment will be described below. Operation of Gm-C filter 703 and the process of controlling the same are the same as with the first exemplary embodiment.

Operation of VGA 907 will be described below. If the mutual conductance of OTA 902 is represented by $G_{m1}$, then since mutual conductance $G_{m2}$ of OTA 901 is set to a multiple (k) by a positive number by mutual conductance control signals 910, 911, it is expressed by:

$$G_{m2}=kG_{m1} \quad (4)$$

From equation (4), gain $A_v'$ and cutoff frequency $\omega_P'$ of VGA 907 are expressed as follows:

$$A_v'=V_{out}/V_{in}=G_{m2}/(sC_L+G_{m1})=kG_{m1}/(sC_L+G_{m1}) \quad (5)$$

$$\omega_P'=G_{m1}/C_L \quad (6)$$

As described above, mutual conductance $G_{m1}$ is automatically controlled by mutual conductance control signal 911 to make $G_{m1}/C_L$ constant regardless of fabrication variations and fluctuations of capacitance $C_L$. Though mutual conductance $G_{m1}$ automatically fluctuates due to fluctuations of capacitance $C_L$, the gain of VGA 907 becomes k times regardless of fluctuations of $G_{m1}$ as can be seen from equation (5) with the arrangement according to the present exemplary embodiment.

According to the present exemplary embodiment, as described above, it is possible to control the gain of VGA 907 independently of the value of mutual conductance $G_{m1}$, and hence to control the gain of VGA 907 with ease.

Figure 10:
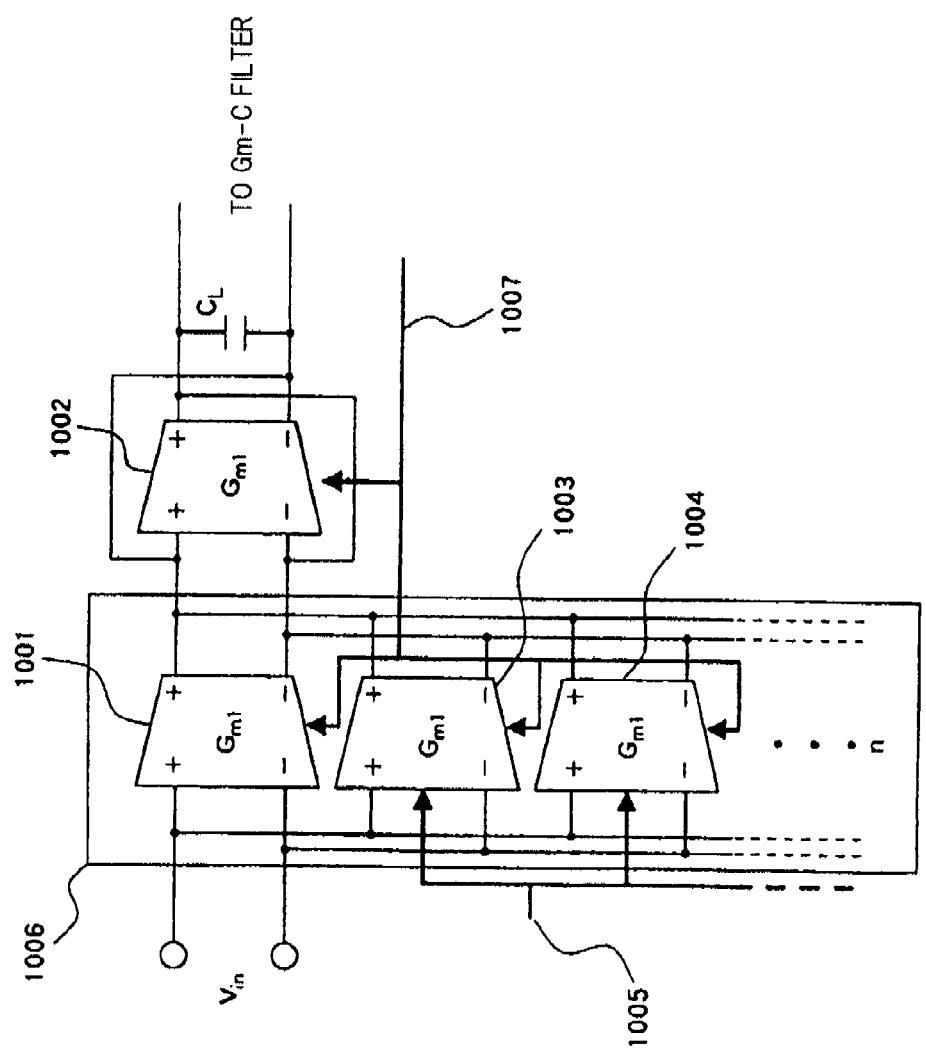
FIG. 10 is a circuit diagram of an arrangement of a VGA according to a third exemplary embodiment of the present invention.

An example wherein mutual conductance $G_{m2}$ of OTA 901 is equalized to $kG_{m1}$ by mutual conductance control signals 910, 911 will be described below. FIG. 10 is a block diagram showing in detail an arrangement of VGA 907 shown in FIG. 9.

In FIG. 10, 1006 represents a low-level arrangement of OTA 901. As shown in FIG. 10, OTAs 1001, 1003, 1004 have input and output terminals connected parallel to each other. The number of OTAs that are connected parallel to each other can be increased if necessary. OTAs 1001, 1002, 1003, 1004 have their mutual conductance controlled by mutual conductance control signal 1007. OTAs 1003, 1004 which are low-level OTAs of OTA 1006 can be activated or inactivated by mutual conductance control signal 1005 which is different from mutual conductance control signal 1007.

With the above arrangement, the overall mutual conductance of OTA 1006 can be controlled between $G_{m1}$ and $nG_{m1}$. In this example, all the low-level OTAs of OTA 1006 have the same mutual conductance. However, the coefficient n may be represented by a real number by using an OTA having a mutual conductance $G_{m1}/2$ which is provided by a different OTA transistor size.

An example wherein the mutual conductance of an OTA, e.g., OTAs 1003, 1004, is controlled by mutual conductance control signal 1007 and wherein the OTA can be activated or inactivated by mutual conductance control signal 1005 will be described below with reference to FIGS. 11a and 11b.

Figure 4A:
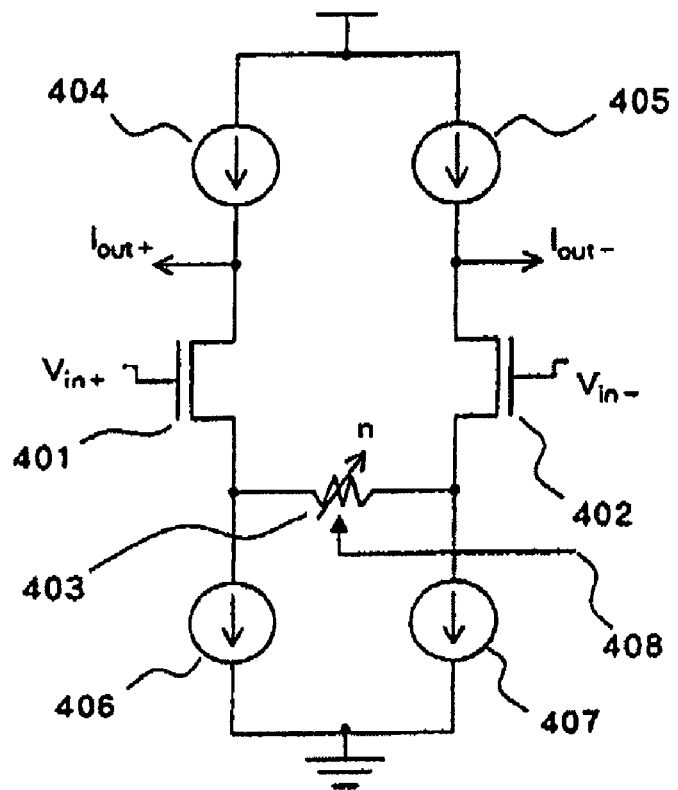
FIG. 4a is a diagram of an example of an OTA according to the related art.
Figure 4B:
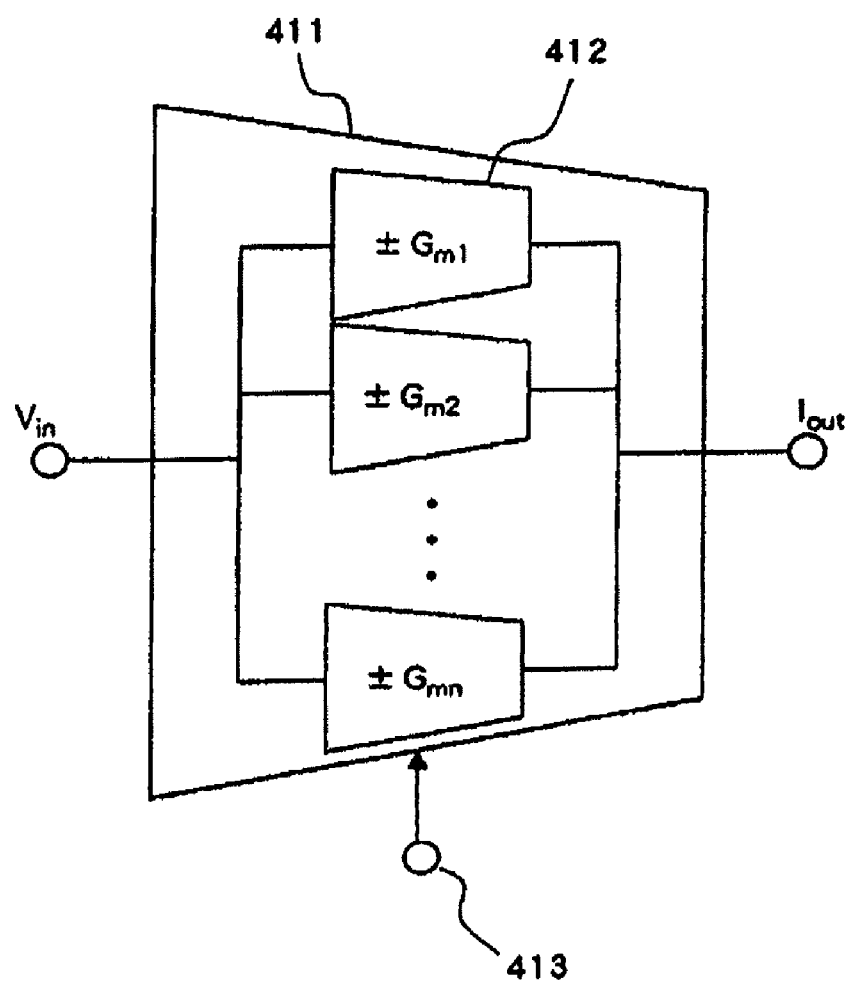
FIG. 4b is a diagram of an example of an OTA according to the related art.
Figure 5A:
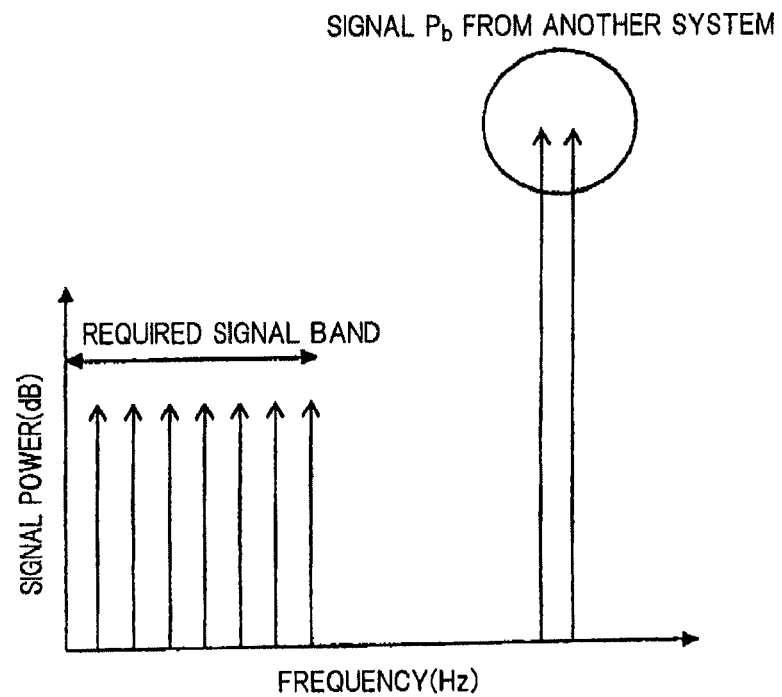
FIG. 5a is a diagram showing frequency characteristics of signals in a wireless system, the view being illustrative of problems according to the related art.
Figure 5B:
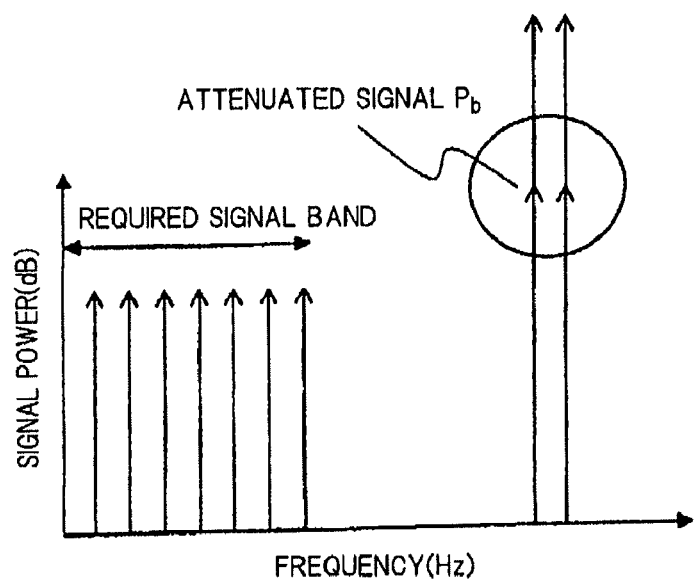
FIG. 5b is a diagram showing frequency characteristics of signals in a wireless system, the view being illustrative of problems according to the related art.
Figure 6:
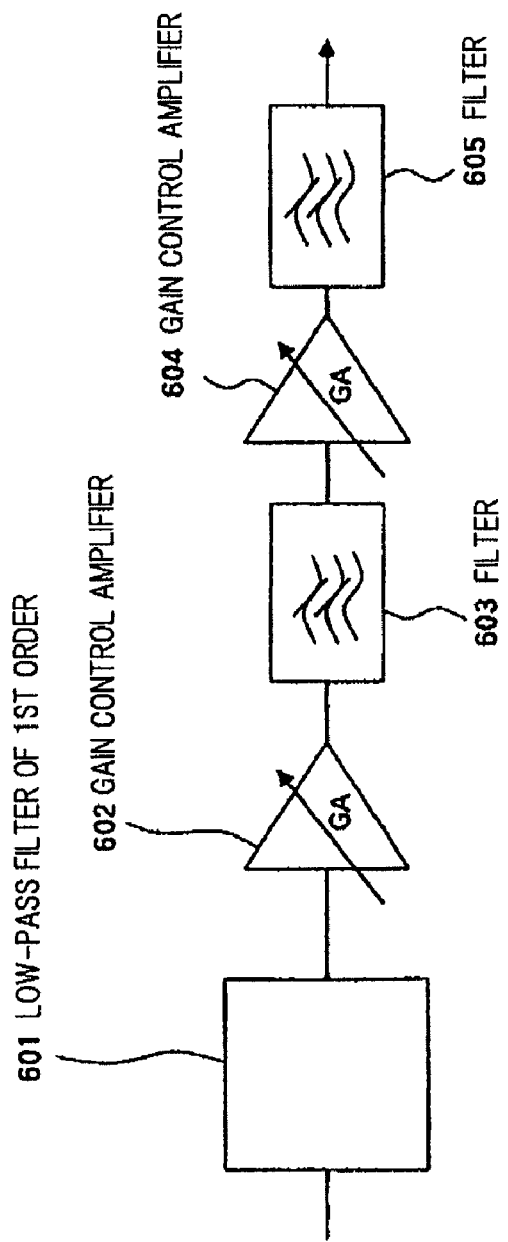
FIG. 6 is a diagram showing an arrangement for removing an unwanted signal appearing outside of a required band according to the related art.
Figure 11A:
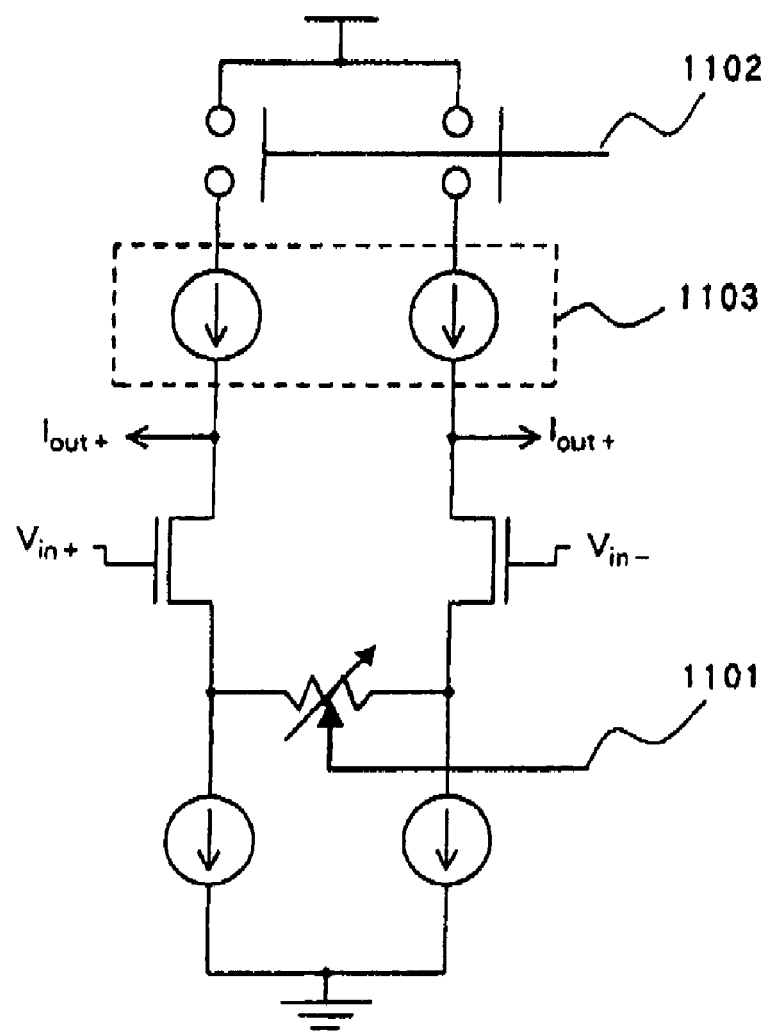
FIG. 11a is a circuit diagram of an arrangement of an OTA according to a fourth exemplary embodiment of the present invention.

According to arrangement shown in FIG. 11a, switch 1102 is inserted between current source 1103 similar to current sources 404, 405 shown in FIG. 4a, and the power supply. Generally, since the current source connected to the power supply comprises a P-ch transistor, the present arrangement can be achieved by inserting a switch between the P-ch transistor and the power supply.

In the arrangement shown in FIG. 11a, when switch 1102 is turned on, the mutual conductance can be set to a desired value by mutual conductance control signal 1101, as with the arrangement of the related art shown in FIG. 4a. When switch 1102 is turned off, the function of the OTA is inactivated.

Figure 11B:
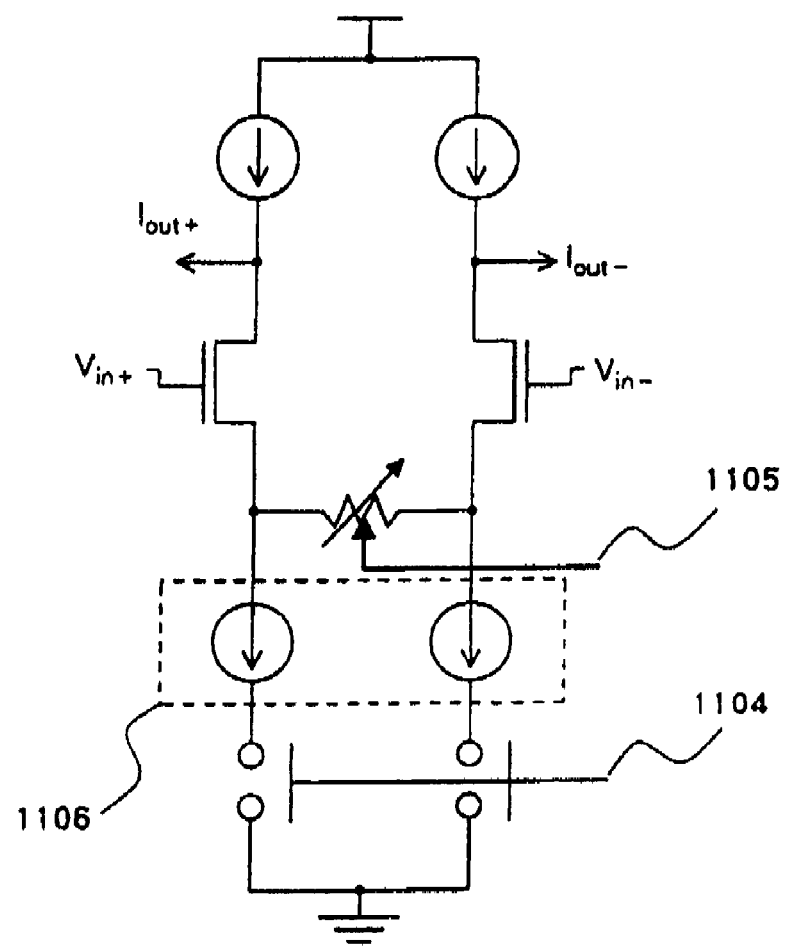
FIG. 11b is a circuit diagram of an arrangement of the OTA according to the fourth exemplary embodiment of the present invention.

With an arrangement shown in FIG. 11b, switch 1104 is inserted between current source 1106 similar to current sources 406, 407 shown in FIG. 4a and the power supply. Generally, since the current source connected to ground comprises an N-ch transistor, the present arrangement can be achieved by inserting a switch between the N-ch transistor and the power supply. In the arrangement shown in FIG. 11b, when switch 1104 is turned on, the mutual conductance can be set to a desired value by mutual conductance control signal 1105, as with the arrangement of the related art shown in FIG. 4a. When switch 1104 is turned off, the function of the OTA is inactivated.

With the present arrangements, mutual conductance control signal 1005 shown in FIG. 10 and mutual conductance control signal 910 shown in FIG. 9 can be controlled by digital signals. Therefore, the OTA can be controlled in a manner such that it is highly resistant to external noise.

The invention claimed is:

1. A filter circuit comprising:
a filter comprising at least one first operational transconductance amplifier having a mutual conductance that varies responsive to a first control signal and a first capacitor;
a second operational transconductance amplifier coupled to input terminals of said filter and having a mutual conductance is controlled by said first control signal;
a third operational transconductance amplifier coupled to input terminals of said second operational transconductance amplifier and having a mutual conductance controlled by said first control signal and having a mutual conductance that is controlled so as to be equalized to a multiple of a real number by a second control signal; and
a second capacitor connected to output terminals of said second and third operational transconductance amplifiers and input terminals of input filter.

2. The filter circuit according to claim 1, wherein said third operational transconductance amplifier comprises at least two fourth operational transconductance amplifiers having input and output terminals connected parallel to each other, and said fourth operational transconductance amplifiers have a mutual conductance controlled by said first control signal and is activated and inactivated by said second control signal.

3. The filter circuit according to claim 2, wherein each of said fourth operational transconductance amplifiers comprises at least one P-channel transistor pair whose source potential varies depending on said first control signal and a switch connected between said P-channel transistor pair and a power supply, and said switch can be turned on and off by said second control signal.

4. The filter circuit according to claim 2, wherein each of said fourth operational transconductance amplifiers comprises at least one N-channel transistor pair whose source potential varies depending on said first control signal and a switch connected between said P-channel transistor pair and a power supply, and said switch can be turned on and off by said second control signal.

5. The filter circuit according to any one of claims 1 through 4, wherein output terminals of said second operational transconductance amplifier are connected to inverting input terminals thereof.

* * * * *